United States Patent [19]

Pfahnl et al.

[11] 4,118,595
[45] Oct. 3, 1978

[54] CROSSOVERS AND METHOD OF FABRICATION

[75] Inventors: Arnold Pfahnl, Allentown, Pa.; Joris Maarten Schuller, Fort Worth, Tex.

[73] Assignee: Bell Telephone Laboratories, Incorporated, Murray Hill, N.J.

[21] Appl. No.: 803,802

[22] Filed: Jun. 6, 1977

[51] Int. Cl.$^2$ .............................................. H05K 1/00
[52] U.S. Cl. .................... 174/68.5; 29/625; 427/54; 427/93; 427/96
[58] Field of Search ........................... 174/68.5, 52 PE

[56] References Cited

U.S. PATENT DOCUMENTS

| B 231,416 | 3/1976 | Marcantonio | 174/68.5 |
|---|---|---|---|
| 2,857,560 | 10/1958 | Schnable et al. | 174/52 PE |
| 2,948,930 | 8/1960 | Herbst | 174/52 PE |
| 3,161,843 | 12/1964 | Hodges et al. | 174/52 PE |
| 3,374,110 | 3/1968 | Miller | 174/68.5 |
| 3,429,981 | 2/1969 | Shallahamer et al. | 174/52 PE |
| 3,461,524 | 8/1969 | Lepselter | 174/68.5 |
| 3,848,079 | 11/1974 | Amin | 174/68.5 |
| 4,001,655 | 1/1977 | Voyles et al. | 174/52 PE |
| 4,042,955 | 8/1977 | Imai | 174/52 PE |

OTHER PUBLICATIONS

Chemical Condensed Dictionary — p. 783.

Primary Examiner—J. V. Truhe
Assistant Examiner—J. H. Bouchard
Attorney, Agent, or Firm—Lester H. Birnbaum

[57] ABSTRACT

Disclosed is a crossover structure and method of fabricating such crossovers in microelectronic circuits. The invention utilizes as a separator between the crossover beam and the conductor on the substrate a mixture of at least 50 percent by weight of fine grain $SiO_2$ and an organic dielectric. For high temperature curing, this dielectric can be a silicone resin. For metallization systems which are sensitive to high temperatures, the dielectric can be a low temperature or ultra-violet curing organic material, such as an epoxy. The crossover processing is simplified by fabricating the beam crossover in direct contact with the insulating layer.

12 Claims, 5 Drawing Figures

CROSSOVERS AND METHOD OF FABRICATION

BACKGROUND OF THE INVENTION

This invention relates to beam or batch bonded crossovers utilizing supplementary insulating layers, and a method of forming beam crossovers in direct contact with such layers.

Conductive crossovers are formed between pairs of conductive paths lying on a substrate in order to bridge over intervening conductive paths, and thereby allow the design and realization of complex hybrid integrated circuits.

The preparation of a conventional beam type crossover structure requires typically a total of 20 processing steps: four materials depositions, 13 chemical steps, and three mechanical assembly steps (including bonding of integrated circuit chips and lead frames, and encapsulation). After cleaning of the substrate, the bottom conductor pattern is generated and a supplementary insulating layer is then screened over the conductor to be crossed and cured. A spacing layer of successive layers of Ti (500 Angstroms) and Cu (250,000 Angstroms) is deposited over the insulating layer. A layer of photoresist is applied over the spacing layer and the regions for the pillars are exposed, developed, and etched into the Ti and Cu. At this point, the region of the crossover span is exposed and developed in the photoresist layer, and pillars and span are formed by plating gold in the exposed areas. Finally, the photoresist is removed and the copper spacing layer is preferentially etched out. The completion of the circuit includes bonding of integrated circuit chips and of lead frames or connectors, and finally the encapsulation and testing. Thus, it may be seen that crossover production requires many stages of processing followed by much handling.

Use of the supplementary insulating layer over the conductor to be crossed results in higher initial yields and less sensitivity to handling damage. A typical prior art insulating layer would comprise approximately 85% by weight of a silicone resin, such as Dow Corning's DC-648, in a solvent, such as xylene, and an addition of 15% by weight of fumed silica to make the mixture screenable without runout. Such prior art resin insulating layers, while having good moisture resistance, soften, swell, and leach with solvents used during the processing of the circuits. In addition, curing of these silicone layers causes undesirable evaporation and redeposition of volatile resin components. A further problem is that the difference in the thermal expansion coefficient of the dielectric and the ceramic with its thin metallizations can lead to poor adhesion of the insulating layer to the substrate and conductor patterns if the circuit is submitted to changes in temperatures during the various processing steps.

It is therefore an objective of this invention to produce beam or batch bonded crossovers utilizing an insulating layer with reduced susceptibility to solvents, minimum volatility, and adequate moisture resistance.

A further problem is that the high curing temperatures required for some insulating layers can cause interdiffusion of metals in temperature sensitive conductor systems and that the curing times are inconveniently long.

Another objective of this invention is therefore to produce crossovers utilizing a low temperature curing insulating layer with improved screening properties, an expansion coefficient matched to the substrate, and maximum long term chemical and mechanical stability.

Yet another object of this invention is to simplify and improve the processing sequence of the crossover structure.

Another problem with prior art crossovers is that they add capacitance to the circuit which can impair the circuit frequency response or propagation delay.

It is therefore a further objective of this invention to produce a crossover structure which adds a minimum crosspoint capacitance to the circuit.

SUMMARY OF THE INVENTION

These and other objectives are achieved in accordance with the invention by preparing a new supplementary insulating layer mixture containing a small amount of organic dielectric and a large amount of solvent and moisture resistant filler materials.

In accordance with one embodiment of the invention the insulating mixture contains approximately 55% by weight of $SiO_2$ particles with a size of about 3 $\mu$m, and approximately 17% by weight of a silicone resin dissolved in approximately 26% by weight of di-isopropylbenzene (DIB). To make the mixture screenable, approximately 2% by weight of a fumed silica can be added. After curing, the mixture contains approximately 79% by weight of $SiO_2$ particles and 21% by weight of resin. The lack of softening and cracking and the good adhesion and volume stability of this new material make it possible to process beam crossover or batch bonded crossover circuits with higher yields than previously possible.

In accordance with a further embodiment of the invention the silicone resin is replaced by a low temperature or ultra-violet curable polymer, while maintaining the high $SiO_2$ content. A typical low temperature material is therefore made up of approximately 20% by weight of an ultra-violet curable epoxy, approximately 75% by weight of $SiO_2$ particles with about 3 $\mu$m diameter, and approximately 5% by weight of fumed silica. The use of such materials is advantageous because of the rapid curing at room temperature within several seconds and the lack of solvents which simplifies and improves the mixing and screening procedures.

In accordance with a further embodiment of the method of the invention, the processing sequence was simplified by using copper only for the crossover beam structure and by plating the copper beam directly onto the insulating layer. This sequence reduces etching times by the elimination of the spacing layer and the etching of the pillar holes. The use of copper rather than gold in the process sequence represents a substantial savings in the production costs of the crossover, although gold or any other platable metal can be used if specific application would so require.

BRIEF DESCRIPTION OF THE DRAWING

These and other features of the invention are delineated in detail in the following description. In the drawing.

DETAILED DESCRIPTION

Figure 1:
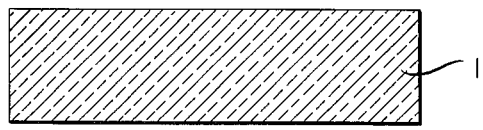
FIGS. 1–5 are cross-sectional views of a portion of a microelectronic circuit during various stages of fabrication in accordance with one embodiment of the present invention.

According to one embodiment of the present invention, approximately 55% by weight of $SiO_2$ was used as the main constituent of the insulating layer material. The SiO₂ preferably has a particle size of 3 μm or less, since larger sized particles cause the supplementary insulating layer to be porous and brittle, and results in nonadherence after repeated prebond cleanings. The low dielectric constant of SiO₂ also minimizes crossover capacitance. Inorganic dielectrics such as SiO₂ have the additional advantage of low linear expansion coefficients. Approximately 17% by weight of a silicone resin having excellent moisture resistance was the binding agent and also provided good supplementary insulating layer adhesion to the conductors and the substrate. The silicone resin used was a polysiloxane polymer having the composition

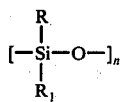

where R, R₁ are phenyl, methyl and hydroxyl radicals and n is approximately 10–20. This material is dissolved in xylene. Such a resin is sold by Dow Corning under the designation DC-648 resin. Organic low temperature curing dielectrics other than silicone resins, such as epoxies, may be used as binding agents in accordance with this invention. Approximately 2% by weight of a fumed silica with particle size approximately 120 Angstroms, such as that sold under the trade name CAB-O-SIL, Grade M-5 by Cabot, was added to prevent run-out from the supplementary insulating layer pads after screening. Approximately 26% by weight of a low vapor pressure solvent such as di-isopropyl benzene was also added to reduce most of the xylene of the resin to improve screen life of the past.

The mixture was first handmixed, and mixing was completed in a three-roll mill. The main purpose of the mill was not the grinding of the mixture, but intimate mixing and wetting of its constituents. Good wetting is desirable to prevent run-out of the material after screening. A pigment, such as Paliofast Blue PB 6911K, manufactured by BASF, can be incorporated to facilitate visual inspection. After application to the circuit the mixture was cured 2 hours at 150° C., followed by four hours at 300° C. It was found that useful ranges for a curing cycle were 5 min–3 hrs at 150° C. followed by 2–6 hours at 300° C. Alternatively, the second step in the cycle may be heating at 250° C. for 5–7 hrs.

It was also found that the curing of the resin was improved when it was exposed to ultra-violet light after the standard curing cycle. Thus, after the cycle above, the resin was exposed to UV light for 3–60 sec. and was thereby made more resistant to solvents. When using the UV treatment, it was also discovered that the second step in the curing cycle can be performed at a temperature as low as 200° C. for 2–6 hours. The cured mixture contained approximately 79 percent by weight of SiO₂ and fumed silica, and approximately 21 percent by weight of resin.

Several tests were performed to determine the compatibility of this new insulating layer with circuit processing. It was found that no loss of adhesion resulted after crossover processing, pre-bond cleaning, and temperature cycling from −40° C. to 150° C. Minimal swelling or softening in solvents such as xylene was observed as compared to prior art resin insulators. There was also practically no leaching after pre-bond cleaning with freon. It was further observed that oxygen plasma cleaning for four hours did not crack the insulating layer, whereas for the prior art resin insulator, cracking resulted after one minute.

It was determined that the final insulating composition should comprise 50–90% by weight of SiO₂ particles (both the fine grain SiO₂ and fumed silica). When the composition had over 90% of SiO₂, a loss of adherence was observed. The proportion of silicone resin is preferably in the range 10–40% by weight in order to bind the SiO₂ particles. The amount of fumed silica is preferably in the range 0.5–5% by weight. Less than this amount does not prevent run-out, while more than this amount results in loss of adhesion. Before curing, the proportion of di-isoproyl benzene is preferably in the range 8–30% by weight.

In accordance with a further embodiment of the invention, the organic dielectric material can be a low temperature or ultra-violet curable epoxy, for fabrication where high temperatures can damage conductor systems. Thus, in one example, an insulating layer was prepared with approximately 75% by weight of SiO₂ particles with a diameter of 3 μm, approximately 20% by weight of an ultra-violet curable epoxy and approximately 5% by weight of fumed silica. The epoxy can be a mixture of diglycidether bisphenol-A and epichlorohydrin. The particular material used was sold by 3M Company under the designation 3M Brand UV Curable Solder Mask Epoxy No. 1301. Other materials which may be suitable include UV curable acrylate and thiolene compounds.

Again, the mixture was first hand mixed and then mixed and homogenized in a roll mill until no change in viscosity was noted. This typically requires 4–10 passes. After application to the circuit, the mixture was cured by high intensity ultra-violet light such as that produced by a Gyrex 6 kW source.

Upon curing, the bisphenol-A and epichlorohydrin combine to form the molecule:

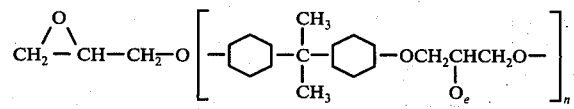

where n is approximately 1–25. During polymerization the molecules link up through the O₁ atom. In cases where chlorinated solvents are used in the circuit fabrication, it has been found that a thermal curing after the ultraviolet curing futher polymerizes the material to make it more resistant to such solvents. This curing is done in a temperature range of 100°–200° C. for 1 to 4 hours.

As before, the composition preferably comprises 50–90% of SiO₂ particle (both the fine grain SiO₂ and fumed silica). The proportion of ultraviolet curable material is preferably in th range of 10–40% in order to bind the SiO₂ particles. The amount of fumed silica is, again, in the range of 0.5–5% by weight.

The epoxy material was found to have the same basic advantage as the resin material, but was shown to be even more stable in resistance to leaching and swelling in solvents. The resin material, however, showed somewhat better moisture resistance. The inclusion of SiO₂ as the major component had the advantage of better adhesion in the circuit fabrication than epoxy alone apparently due to the close match of the thermal coefficient of expansion of the insulating material and the ceramic and metallization. As before, the crosspoint capacitance was reduced due to the low dielectric constant of the SiO₂ particles.

There is another advantage of the new compositions when using conventional crossover processing with spacing layers. Previous experience with supplementary insulating layers had shown that for crossover processing the adherence of the plated spacing layer (Cu) was sufficient only when an adhesive layer (Ti) was present. With the present invention, it was found that the Cu spacing layer adherence was sufficient in all cases without the Ti adhesive layer when the copper was evaporated onto a heated substrate. Adhesion may also have improved due to increased surface roughness and the reduced expansion of the insulating layer during evaporation. In fact, it was discovered that adhesion was improved when the epoxy was roughened by immersion in a mixture of 30 gms chromic acid, 50 milliliters of water and 1 liter of sulfuric acid for approximately 5 sec.

Figure 2:
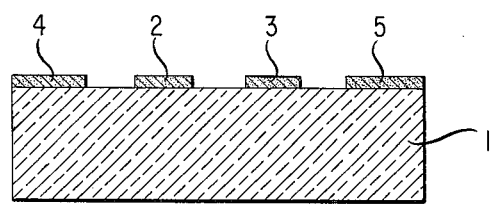

The crossover structure utilizing these insulating layers in accordance with the invention also permits a simplified crossover fabrication as illustrated in the cross-sectional views of FIGS. 1-5. In FIG. 1 there is illustrated a substrate 1, typically glass or ceramic, which may utilize the insulating layer in accordance with this embodiment of the method of the present invention. After cleaning the substrate, the bottom conductor pattern was generated in a conventional manner by evaporation and plating of conductive materials, followed by delineating the bottom conductor by etching, using photoresist as an etch stop. In FIG. 2, the resulting conductor pattern is shown comprising conductive elements 2 and 3 which are to be crossed and elements 4 and 5 which are to be conductively connected over elements 2 and 3. For the purposes of illustration, only four elements are shown on the substrate but it should be clear that a number of elements may be crossed or connected on a typical hybrid integrated circuit.

Figure 3:
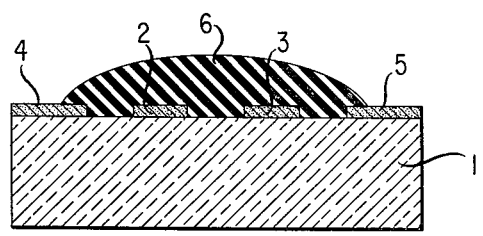
Figure 4:
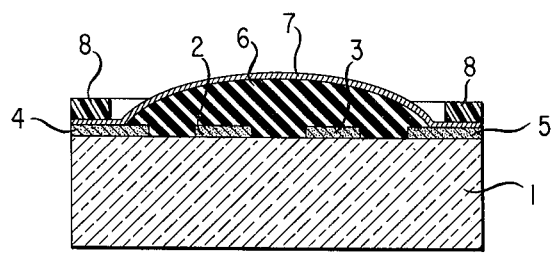
Figure 5:
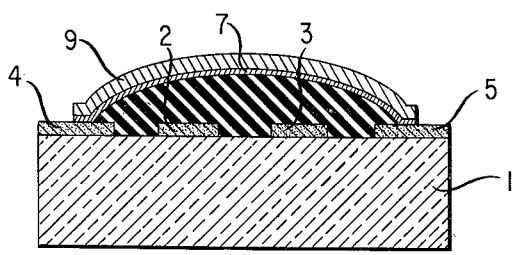

As shown in FIG. 3, the previously described dielectric insulating layer 6 was then screen printed to a thickness of approximately 2 to 4 mils over the bottom conductor pattern in accordance with standard techniques. Preferably, the overlap of the insulating layer over the conductor elements 4 and 5 should be minimized to permit bonding or plating, but the layer should at least touch the conductor edges so that there is no groove which makes metallization difficult. The layer was then cured in accordance with the curing cycles described above for the various insulating layer compositions. Next, as shown in FIG. 4, a layer of copper 7 was evaporated over the insulating layer, ceramic, and conductors 4 and 5 to a thickness of approximately 5000 Angstroms while the substrate was heated to approximately 100° C. A preferred range for heating the substrate is 50°-150° C. Alternatively, the copper may be formed by electroless deposition. A preferred thickness for this layer is 3,000-10,000 angstroms. A photoresist layer 8 was then deposited over the copper layer 7 and the beam pattern was exposed and developed in the photoresist layer 8 in accordance with well-known photoengraving techniques giving the structure of FIG. 4. Any commonly used photoresist may be employed. Copper layer 9 was plated in the beam area to a thickness in the range of 10 to 15 μm, with the photoresist 8 acting as a plating resist. The beam is shown as separate layers 7 and 9 for purposes of illustration. Finally, the photoresist 8 was removed in a conventional manner, and the portion of the copper layer 7 not covered by layer 9 was etched, removing an equal amount of copper from the beams. This may be accomplished by the use of any well-known etching technique utilizing conventional etchants such as ammonium persulfate. FIG. 5 illustrates the completed crossover structure.

It was found that yields were extremely high (greater than 99%) and adherence of the copper to the insulating layer was more than adequate for crossover fabrication. Adhesion was further improved by roughening the insulator surface as described previously. The method of the present invention therefore provides a simplified process in permitting deposition of the beam directly on the insulating layer, and since Cu rather than gold is used, should result in significant cost reduction.

Although the preferred embodiments of this invention have been described in detail, it is to be understood that various changes, substitutions and alterations can be made without departing from the spirit and scope of the invention.

What is claimed is:

1. In a microelectronic circuit comprising a pair of conductive elements and a conductor therebetween on an insulating substrate, a structure which provides an electrical connection between said pair of conductive elements comprising an insulating layer formed over the conductor between said pair, said insulating layer comprising 50-90% by weight SiO₂ with a particle size of 3 μm or less and including 0.5-5% by weight of fumed silica and 10-40% by weight of an organic dielectric, and a crossover conductor formed on said insulating layer making electrical contact between said pair of conductive elements.

2. The circuit according to claim 1 wherein said organic dielectric is a silicone resin.

3. The circuit according to claim 1 wherein said organic dielectric is an epoxy.

4. The circuit according to claim 2 wherein the silicone resin comprises a polymer of the formula

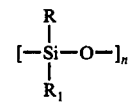

where R, R₁ are phenyl, methyl and hydroxyl radicals and n is approximately 10-20.

5. The circuit according to claim 3 wherein the epoxy comprises a polymer of the formula

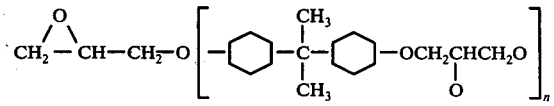

where n is approximately 1-25.

6. The circuit according to claim 1 wherein said crossover conductor consists essentially of copper.

7. A method of forming electrical connectors between a pair of conductive elements and across a conductor therebetween formed on an insulating substrate, comprising the steps of:
screen printing an insulating layer across the conductor to be crossed where said insulating layer comprises 50-90% by weight SiO₂ with a particle size of 3 μm or less and including 0.5-5% by weight of fumed silica and 10–40% by weight of an organic dielectric;

curing said insulating layer; and depositing a crossover conductor over said insulating layer and contacting said pair of conductive elements.

8. The method according to claim 7 wherein the organic dielectric is a silicone resin.

9. The method according to claim 7 wherein the organic dielectric is an epoxy.

10. The method of claim 8 in which said insulating layer before curing additionally comprises 8–30% by weight of di-isopropyl benzene.

11. The method according to claim 7 wherein the crossover conductor is formed by evaporating a first layer of copper over said insulating layer and pair of conductive elements, plating a second copper layer over said first copper layer selectively between said pair of conductive elements such that said copper layers make electrical contact between said pair of conductive elements, and etching said first copper layer in the areas not covered by said second copper layer leaving said first and second copper layers between said conductive elements.

12. The method according to claim 8 further comprising the step of exposing the insulating layer to ultra-violet light after curing said layer so as to increase its resistance to solvents.

* * * * *